United States Patent
Banerjee et al.

(10) Patent No.: US 11,163,924 B2
(45) Date of Patent: Nov. 2, 2021

(54) IDENTIFICATION OF CHANGES IN FUNCTIONAL BEHAVIOR AND RUNTIME BEHAVIOR OF A SYSTEM DURING MAINTENANCE CYCLES

(71) Applicant: Tata Consultancy Services Limited, Mumbai (IN)

(72) Inventors: Amar Satyabroto Banerjee, Pune (IN); Subhrojyoti Roy Chaudhuri, Pune (IN); Puneet Patwari, Pune (IN); Swaminathan Natarajan, Pune (IN)

(73) Assignee: Tata Gonsultancy Services Limited, Mumbai (IN)

( * ) Notice: Subject to any disclaimer, the term of this patent is extended or adjusted under 35 U.S.C. 154(b) by 547 days.

(21) Appl. No.: 16/246,245

(22) Filed: Jan. 11, 2019

(65) Prior Publication Data
US 2019/0236223 A1    Aug. 1, 2019

(30) Foreign Application Priority Data
Jan. 23, 2018    (IN) .............................. 201821002775

(51) Int. Cl.
*G06F 9/44*    (2018.01)
*G06F 30/20*    (2020.01)
(Continued)

(52) U.S. Cl.
CPC ................ *G06F 30/20* (2020.01); *G06F 8/71* (2013.01); *G06F 11/22* (2013.01);
(Continued)

(58) Field of Classification Search
None
See application file for complete search history.

(56) References Cited

U.S. PATENT DOCUMENTS

| 4,364,110 A | 12/1982 | Hyatt |
| 6,076,180 A * | 6/2000 | Meyer ................... G06F 11/221 |
| | | 714/735 |

(Continued)

OTHER PUBLICATIONS

Levy, J. et al. (2002). "Combining Monitors for Runtime System Verification," *Electronic Notes in Theoretical Computer Science*, vol. 70, No. 4; pp. 1-16.

*Primary Examiner* — Qamrun Nahar
(74) *Attorney, Agent, or Firm* — Finnegan, Henderson, Farabow, Garrett & Dunner LLP

(57) ABSTRACT

Identification of changes in functional and runtime behavior of a system during maintenance cycles. The traditional methods provide for viewing the problem of change identification de-coupled from system design, thus making the process further human dependent and increasing the time and probability of errors. Embodiment of the present disclosure provide for identification of changes in the functional behavior and the runtime behavior of the system by acquiring, a design comprising of structures and behaviors of the system, generating a design model and a set of implementation codes based upon the design, updating the set of implementation codes with log statements, constructing a design model based upon log files, constructing an operations model based upon the design model and comparing the operations model and a design table, to identify changes in the functional behavior and the runtime behavior of the system using an operations verification component.

20 Claims, 13 Drawing Sheets

(51) Int. Cl.
    *G06F 8/71*     (2018.01)
    *G06F 11/34*    (2006.01)
    *G06F 11/22*    (2006.01)
    *G06F 11/36*    (2006.01)
    *G06F 8/35*     (2018.01)
    *G06F 8/77*     (2018.01)

(52) U.S. Cl.
    CPC ...... *G06F 11/3466* (2013.01); *G06F 11/3476* (2013.01); *G06F 11/3612* (2013.01); *G06F 11/3616* (2013.01); *G06F 11/3692* (2013.01); *G06F 8/35* (2013.01); *G06F 8/77* (2013.01); *G06F 11/3636* (2013.01)

(56) References Cited

U.S. PATENT DOCUMENTS

| | | | |
|---|---|---|---|
| 6,453,450 B1 | 9/2002 | Walter | |
| 7,386,827 B1 * | 6/2008 | Zhu | G06F 30/33 716/103 |
| 8,255,191 B1 * | 8/2012 | Kolpekwar | G06F 30/33 703/17 |
| 2002/0184610 A1 * | 12/2002 | Chong | G06F 8/20 717/109 |
| 2003/0028825 A1 * | 2/2003 | Hines | G06F 11/2294 714/37 |
| 2006/0023638 A1 | 2/2006 | Monaco et al. | |
| 2016/0357889 A1 * | 12/2016 | Garg | G06F 30/30 |

* cited by examiner

```
ControlNode Servo_CN {
    childNodes ( LNC.LNC_CN )
    Associated Interface Description : Servo_ID CommandResponseBlock {
        Command Servo.Servo_ID.START {
            Transitions {
                currentState Servo.Servo_ID.OFF => nextState Servo.Servo_ID.ON (
                entryAction Action [ fireEvents : Servo.Servo_ID.STARTED ] )
            }
        }
    }
    EventBlock {
        Event Servo.Servo_ID.STARTED {
        }
    }
}
```

Command Behavior

Event Behavior

Servo Behavior design (system design) example comprising computer system concepts, structures and behavior corresponding to monitoring and control domain

FIG. 4A

```
            Model Servo
            InterfaceDescription Servo_ID{
Commands    commands {
                START[], STOP[]
            }
            operatingStates {
  States        ON[],OFF[]
                startState : ON
                endState : OFF
            }
Data Points dataPoints {
                int RMP[]
            }
            events {
                STARTED[],STOPPED[]
            }                Interface
            }                Events
```

Servo Interface Design

FIG. 4B

IDENTIFICATION OF CHANGES IN FUNCTIONAL BEHAVIOR AND RUNTIME BEHAVIOR OF A SYSTEM DURING MAINTENANCE CYCLES

PRIORITY CLAIM

This U.S. patent application claims priority under 35 U.S.C. § 119 to: India Application No. 201821002775, filed on Jan. 23, 2018. The entire contents of the aforementioned application are incorporated herein by reference.

TECHNICAL FIELD

This disclosure relates generally to identification of changes in functional behavior and runtime behavior of a system during maintenance cycles, and more particularly to methods and Systems for to identification of changes in functional behavior and runtime behavior of a system during maintenance cycles.

BACKGROUND

A system undergoing maintenance is subject to a lot of behavioral and other changes. However, a change introduced into the system is mostly done by human and has to be manually traced back to the corresponding change in system design. Most computer systems cannot be completely verified before they are put in service. The high complexity of complete fielded systems places them beyond the reach of exhaustive formal analysis tools, such as model checkers and theorem provers. Furthermore, many systems rely on third-party components, for which a complete specification (or even source code) is not available. The traditional methods focus simply on manual modification of codes and thus, are reactive and involve considerable manual efforts for understanding the system design as well as system execution. Further, over a period of time the associated design becomes obsolete due to lack of traceability.

Some of the traditional methods provide for maintaining traceability from the system design to codes, but modified codes across multiple maintenance cycles mostly do not trace back directly to the system design since it is a daunting manual task. Hence, it becomes difficult to identify a change in the system execution corresponding to system design with time. Further, the traditional methods provide for a change identification when the system starts showing different behavior than usual. With the traditional approach, system logs analysed to find out the cause for a change in system behavior.

The traditional methods look at the problem of change identification de-coupled from the system design, making the process further human dependent. As a result, the time and probability of error in identifying cause for the change increases. Runtime verification permits checking system properties that cannot be fully verified off-line. This is particularly true when the system includes complex third-party components, such as general-purpose operating systems and software libraries, and when the properties of interest include security and performance. Runtime verification specifications are typically expressed in trace predicate formalisms, such as finite state machines, regular expressions, context-free patterns, linear temporal logics, etc., or extensions of these. This allows for a less ad-hoc approach than normal testing. However, any mechanism for monitoring an executing system is considered runtime verification, including verifying against test oracles and reference implementations.

Runtime verification may be implemented for many purposes, such as security or safety policy monitoring, debugging, testing, etc. Runtime verification avoids the complexity of traditional formal verification techniques, such as model checking and theorem proving, by analysing only one or a few execution traces and by working directly with the actual system, thus scaling up relatively well and giving more confidence in the results of the analysis at the expense of less coverage. Some of the traditional methods provide for runtime verification but do not provide for an auto code generation and creating different views from the point of view of different stakeholders e.g., designer, developer, operations engineer etc.

SUMMARY

Embodiments of the present disclosure present technological improvements as solutions to one or more of the above-mentioned technical problems recognized by the inventors in conventional systems. For example, in one embodiment, a method for identification of changes in functional behavior and runtime behavior of a system during maintenance cycles is provided, the method comprising: acquiring, by one or more hardware processors, a system design, wherein the system design comprises computer system concepts, structures and behavior corresponding to monitoring and control domain; constructing, a design model, based upon the system design, wherein the design model comprises a first set of neighborhood values corresponding to the functional behavior elements of the system design; auto-generating, a set of implementation codes, based upon the design model and the system design, wherein the set of implementation codes comprise one or more framework based codes; performing, by the one or more hardware processors, a plurality of steps, based upon the set of implementation codes, wherein the plurality of steps comprise: (i) updating, using a log statement insertion component, a plurality of log statements into the set of implementation codes, wherein the plurality of log statements comprise information corresponding to the runtime behavior of the system; and (ii) populating, one or more log files, wherein the one or more log files comprise information corresponding to execution details of the system, and wherein the one or more log files are updated with the execution details using the plurality of log statements; constructing, one or more models, based upon the one or more log files, wherein the one or more models comprise of a set of information corresponding to the execution details of the system captured to derive a runtime view and operational details of the system; constructing, an operations model, based upon the one or more models, wherein the operations model comprises a second set of neighborhood values corresponding to the execution details of the system to compare actual and intended designs of the system; comparing, using an operations verification component, the operations model and a design table, to identify changes in the functional behavior and the runtime behavior of the system; generating the second set of neighborhood values based upon a distance between a second set of input vertices and a second set of output vertices of the operations model represented in a second graph; auto-creating the design table based upon the system design and using a modeling language to generate a set of reference entities, and wherein the set of reference entities facilitate identification of changes in the runtime behavior of the system; representing the design table in a first graph comprising of a first set of input vertices and a first set of output vertices, wherein the first set of input vertices comprise of one or more interface components, wherein edges in the first graph are functions connecting the first set of input vertices and the first set of output vertices, and wherein the first graph indicates a flow of functional execution of the system; generating the first set of neighborhood values based upon the system design for facilitating the comparison of the operations model and the design table, wherein the first set of neighborhood values are further generated based upon a distance between the first set of input vertices and the first set of output vertices in the first graph, and wherein the first graph is an interaction graph, and wherein an interaction in the interaction graph comprises of a direct interaction or an indirect interaction depending upon a number of edges corresponding to a function of the edges in the interaction graph; inserting the plurality of log statements into the one or more framework based codes as one or more key-value pairs by a code generator using the design table and wherein a key comprises one or more components corresponding to one or more interface components and a value is logged as a value corresponding to the key; updating the operations model based upon a set of executed functionalities corresponding to the system and the plurality of log statements inserted in the one or more log files to identify changes in the functional behavior and the runtime behavior of the system; and varying the second set of neighborhood values depending upon a direct interaction or an indirect interaction in an interaction graph.

In another aspect, there is provided a system for identification of changes in functional behavior and runtime behavior of another system during maintenance cycles. The system comprising: a memory storing instructions; one or more communication interfaces; and one or more hardware processors coupled to the memory via the one or more communication interfaces, wherein the one or more hardware processors are configured by the instructions to acquire, by the one or more hardware processors, a system design, wherein the system design comprises computer system concepts, structures and behavior corresponding to monitoring and control domain; construct, a design model, based upon the system design, wherein the design model comprises a first set of neighborhood values corresponding to the functional behavior elements of the system design; auto-generate, a set of implementation codes, based upon the design model and the system design, wherein the set of implementation codes comprise one or more framework based codes; perform, by the one or more hardware processors, a plurality of steps, based upon the set of implementation codes, wherein the plurality of steps comprise: (i) update, using a log statement insertion component, a plurality of log statements into the set of implementation codes, wherein the plurality of log statements comprise information corresponding to the runtime behavior of another system; and (ii) populate, one or more log files, wherein the one or more log files comprise information corresponding to execution details of the another system, and wherein the one or more log files are updated with the execution details using the plurality of log statements; construct, one or more models, based upon the one or more log files, wherein the one or more models comprise of a set of information corresponding to the execution details of the another system captured to derive a runtime view and operational details of the another system; construct, an operations model, based upon the one or more models, wherein the operations model comprises a second set of neighborhood values corresponding to the execution details of the another system to compare actual and intended designs of the another system; compare, using an operations verification component, the operations model and a design table, to identify changes in the functional behavior and the runtime behavior of the another system; generate the second set of neighborhood values based upon a distance between a second set of input vertices and a second set of output vertices of the operations model represented in a second graph; auto-create the design table based upon the system design and using a modeling language to generate a set of reference entities, and wherein the set of reference entities facilitate identification of changes in the runtime behavior of the another system; represent the design table in a first graph comprising of a first set of input vertices and a first set of output vertices, wherein the first set of input vertices comprise of one or more interface components, wherein edges in the first graph are functions connecting the first set of input vertices and the first set of output vertices, wherein the first graph indicates a flow of functional execution of the another system, wherein the first graph is an interaction graph, and wherein an interaction in the interaction graph comprises of a direct interaction or an indirect interaction depending upon a number of edges corresponding to a function of the edges in the interaction graph; generate the first set of neighborhood values based upon the system design for facilitating the comparison of the operations model and the design table, and wherein the first set of neighborhood values are further generated based upon a distance between the first set of input vertices and the first set of output vertices in the first graph; insert the plurality of log statements into the one or more framework based codes as one or more key-value pairs by a code generator using the design table and wherein a key comprises one or more components corresponding to one or more interface components and a value is logged as a value corresponding to the key; update the operations model based upon a set of executed functionalities corresponding to the another system and the plurality of log statements inserted in the one or more log files to identify changes in the functional behavior and the runtime behavior of the system; and vary the second set of neighborhood values depending upon a direct interaction or an indirect interaction in an interaction graph.

In yet another aspect, there is provided one or more non-transitory machine readable storage mediums comprising one or more instructions which when executed by one or more hardware processors causes the one or more hardware processor to perform a method for identification of changes in functional behavior and runtime behavior of a system during maintenance cycles, the method comprising: acquiring, by one or more hardware processors, a system design, wherein the system design comprises computer system concepts, structures and behavior corresponding to monitoring and control domain; constructing, a design model, based upon the system design, wherein the design model comprises a first set of neighborhood values corresponding to the functional behavior elements of the system design; auto-generating, a set of implementation codes, based upon the design model and the system design, wherein the set of implementation codes comprise one or more framework based codes; performing, by the one or more hardware processors, a plurality of steps, based upon the set of implementation codes, wherein the plurality of steps comprise: (i) updating, using a log statement insertion component, a plurality of log statements into the set of implementation codes, wherein the plurality of log statements comprise information corresponding to the runtime behavior of the system; and (ii) populating, one or more log files, wherein the one or more log files comprise information corresponding to execution details of the system, and wherein the one or more log files are updated with the execution details using the plurality of log statements; constructing, one or more models, based upon the one or more log files, wherein the one or more models comprise of a set of information corresponding to the execution details of the system captured to derive a runtime view and operational details of the system; constructing, an operations model, based upon the one or more models, wherein the operations model comprises a second set of neighborhood values corresponding to the execution details of the system to compare actual and intended designs of the system; comparing, using an operations verification component, the operations model and a design table, to identify changes in the functional behavior and the runtime behavior of the system; generating the second set of neighborhood values based upon a distance between a second set of input vertices and a second set of output vertices of the operations model represented in a second graph; auto-creating the design table based upon the system design and using a modeling language to generate a set of reference entities, and wherein the set of reference entities facilitate identification of changes in the runtime behavior of the system; representing the design table in a first graph comprising of a first set of input vertices and a first set of output vertices, wherein the first set of input vertices comprise of one or more interface components, wherein edges in the first graph are functions connecting the first set of input vertices and the first set of output vertices, and wherein the first graph indicates a flow of functional execution of the system; generating the first set of neighborhood values based upon the system design for facilitating the comparison of the operations model and the design table, wherein the first set of neighborhood values are further generated based upon a distance between the first set of input vertices and the first set of output vertices in the first graph, and wherein the first graph is an interaction graph, and wherein an interaction in the interaction graph comprises of a direct interaction or an indirect interaction depending upon a number of edges corresponding to a function of the edges in the interaction graph; inserting the plurality of log statements into the one or more framework based codes as one or more key-value pairs by a code generator using the design table and wherein a key comprises one or more components corresponding to one or more interface components and a value is logged as a value corresponding to the key; updating the operations model based upon a set of executed functionalities corresponding to the system and the plurality of log statements inserted in the one or more log files to identify changes in the functional behavior and the runtime behavior of the system; and varying the second set of neighborhood values depending upon a direct interaction or an indirect interaction in an interaction graph.

It is to be understood that both the foregoing general description and the following detailed description are exemplary and explanatory only and are not restrictive of the disclosure, as claimed.

BRIEF DESCRIPTION OF THE DRAWINGS

The embodiments herein will be better understood from the following detailed description with reference to the drawings, in which:

FIGS. 4A and 4B illustrate examples of system design comprising computer system concepts, structures and behavior corresponding to monitoring and control domain captured using a modeling language according to some embodiments of the present disclosure.

DETAILED DESCRIPTION

Figure 1:
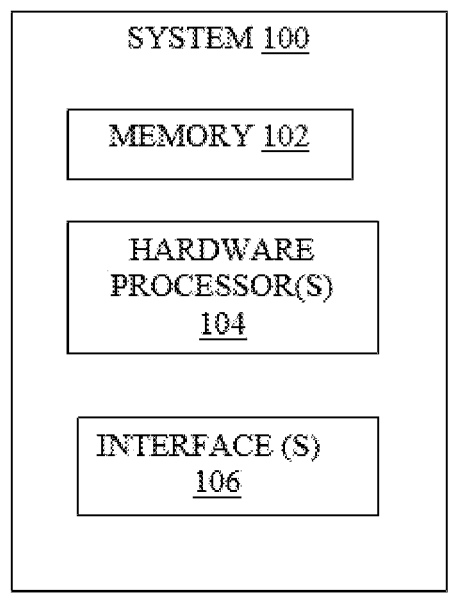
FIG. 1 illustrates a block diagram of a system for identification of changes in functional behavior and runtime behavior of another system (or a system under consideration) during maintenance cycles according to some embodiments of the present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

embodiments of the present disclosure provide systems and methods for identification of changes in functional behavior and runtime behavior of a system (that is another system comprising of a computing device, also hereinafter referred to as system under consideration) during maintenance cycles. A system undergoing maintenance is subject to a lot of behavioral and other changes. However, a change introduced into the system is mostly done by human and has to be manually traced back to the corresponding change in the design. Most computer systems cannot be completely verified before they are put in service. The high complexity of complete fielded systems places them beyond the reach of exhaustive formal analysis tools, such as model checkers and theorem provers. Furthermore, many systems rely on third-party components, for which a complete specification (or even source code) is not available. The traditional methods focus simply on manual modification of codes and over a period of time the associated design becomes obsolete due to lack of traceability.

The traditional methods view the problem of change identification de-coupled from the system design, making the process further human dependent. As a result, the time and probability of error increases. Runtime verification permits checking system properties that cannot be fully verified off-line. This is particularly true when the system includes complex third-party components, such as general-purpose operating systems and software libraries, and when the properties of interest include security and performance. Runtime verification specifications are typically expressed in trace predicate formalisms, such as finite state machines, regular expressions, context-free patterns, linear temporal logics, etc., or extensions of these. This allows for a less ad-hoc approach than normal testing. However, any mechanism for monitoring an executing system is considered runtime verification, including verifying against test oracles and reference implementations. Some of the traditional methods provide for runtime verification but do not provide for an auto code generation and creating different views from the point of view of different stakeholders e.g., designer, developer, operations engineer etc.

Hence, there is a need for a technology that provides for a change identification by viewing the system design from the operations viewpoint creating a common reference for the design and the operation. As the system executes, the logged execution details must be proactively validated by the methodology to check its consistency with the design. Further, the technology must provide as to how a strategy can be embedded into the code of the software system, by embedding loggers at problem places in the code, and thus providing for a pro-active monitoring of the system operations to monitor the system behavior execution.

Referring now to the drawings, and more particularly to FIG. 1 through FIG. 13, where similar reference characters denote corresponding features consistently throughout the figures, there are shown preferred embodiments and these embodiments are described in the context of the following exemplary system and/or method.

FIG. 1 illustrates an exemplary block diagram of a system 100 for identification of changes in the functional behavior and the runtime behavior of the another system or the system under consideration, comprising of the computing device) during maintenance cycles according to an embodiment of the present disclosure. In an embodiment, the system 100 includes one or more processors 104, communication interface device(s) or input/output (I/O) interface(s) 106, and one or more data storage devices or memory 102 operatively coupled to the one or more processors 104. The one or more processors 104 that are hardware processors can be implemented as one or more microprocessors, microcomputers, microcontrollers, digital signal processors, central processing units, state machines, logic circuitries, and/or any devices that manipulate signals based on operational instructions. Among other capabilities, the processor(s) is configured to fetch and execute computer-readable instructions stored in the memory. In an embodiment, the system 100 can be implemented in a variety of computing systems, such as laptop computers, notebooks, hand-held devices, workstations, mainframe computers, servers, a network cloud and the like.

The I/O interface device(s) 106 can include a variety of software and hardware interfaces, for example, a web interface, a graphical user interface, and the like and can facilitate multiple communications within a wide variety of networks N/W and protocol types, including wired networks, for example, LAN, cable, etc., and wireless networks, such as WLAN, cellular, or satellite. In an embodiment, the I/O interface device(s) can include one or more ports for connecting a number of devices to one another or to another server.

The memory 102 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

In an embodiment, the another system (or the system under consideration) for which the methodology for identification of changes in the functional behavior and the runtime behavior has been proposed comprises of a computing device, wherein the computing device may be a computer system, laptop, keyboard etc. or any other computing device further comprising of all hardware and software components such as a memory, hardware processor/s, mouse, operating system, memory, peripheral devices etc. which are required to make the computing device capable of executing all tasks via a set of instructions, for example, programs. Further, the system on which the methodology for identification of changes in the functional behavior and the runtime behavior has been implemented and tested, which may be similar to or different from the system 100 referred to in this disclosure. The term 'another system' refers to a system on which the proposed methodology has been implemented and tested (that is the system under consideration), which may be similar to or different from the system 100 referred to in this disclosure. The terms 'another system' and 'system under consideration' may be used interchangeably.

Figure 2A:
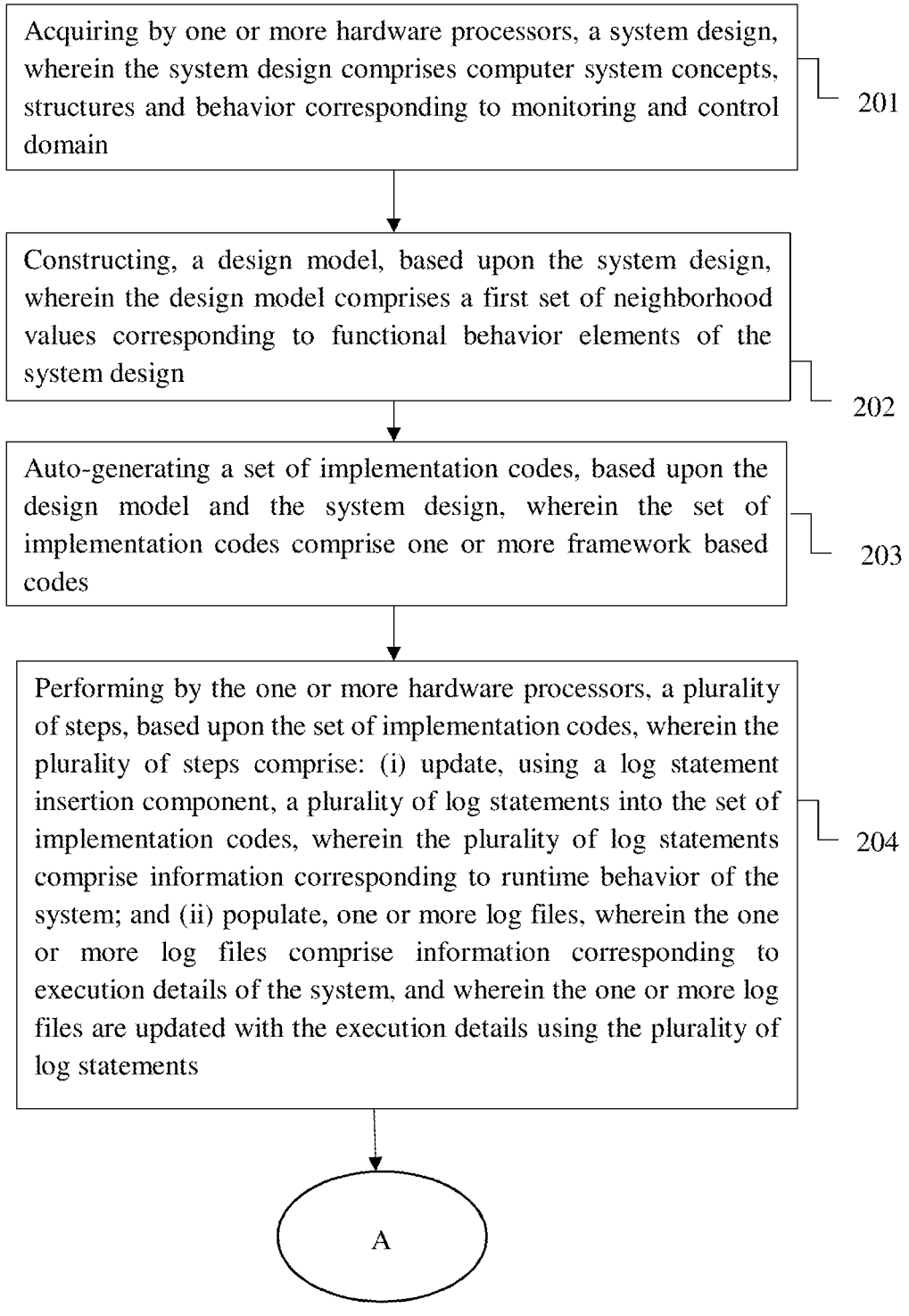
FIG. 2A through 2B is a flowchart illustrating the steps involved for identification of changes in the functional behavior and the runtime behavior of the system under consideration during maintenance cycles according to some embodiments of the present disclosure.
Figure 2B:
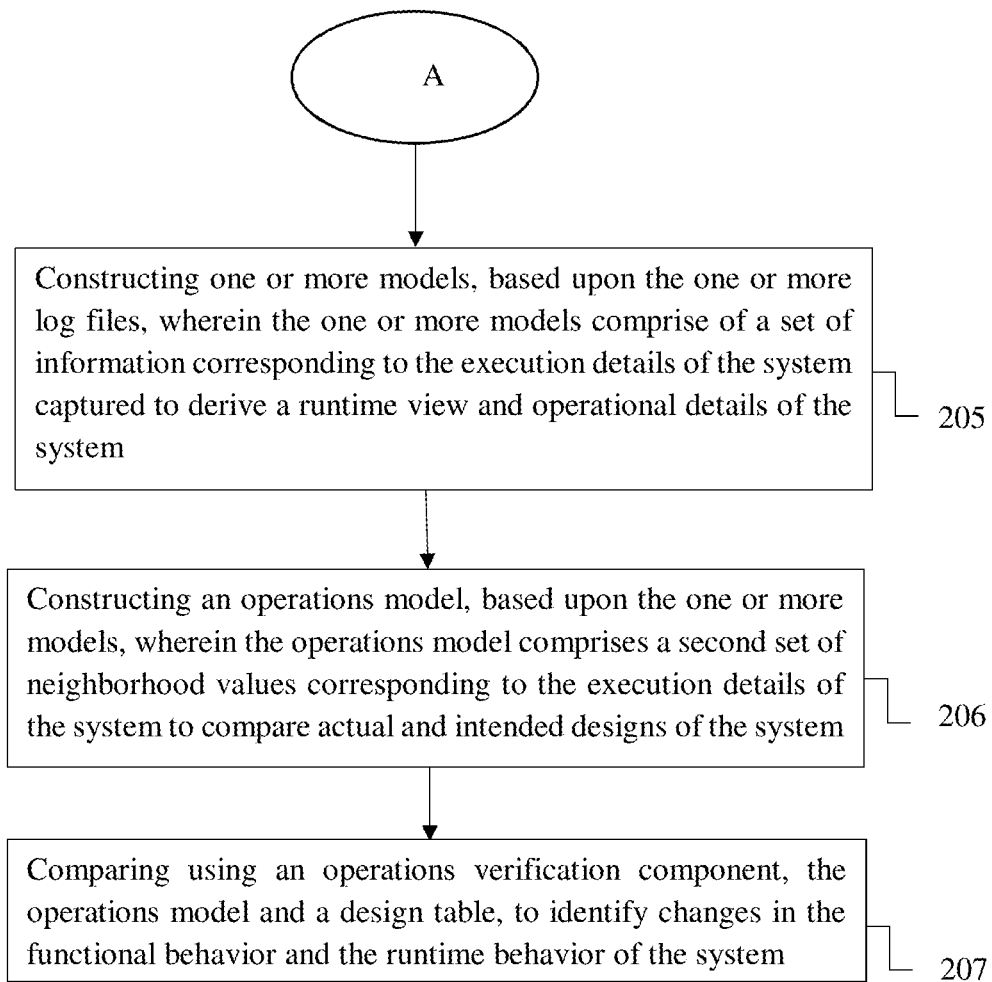

FIG. 2A through 2B, with reference to FIG. 1, illustrates an exemplary flow diagram of a method for identification of changes in the functional behavior and the runtime behavior of the system under consideration during maintenance cycles according to an embodiment of the present disclosure. In an embodiment the system 100 comprises one or more data storage devices of the memory 102 operatively coupled to the one or more hardware processors 104 and is configured to store instructions for execution of steps of the method by the one or more processors 104. The steps of the method of the present disclosure will now be explained with reference to the components of the system 100 as depicted in FIG. 1 and the flow diagram. In the embodiments of the present disclosure, the hardware processors 104 when configured the instructions performs one or more methodologies described herein.

Figure 3:
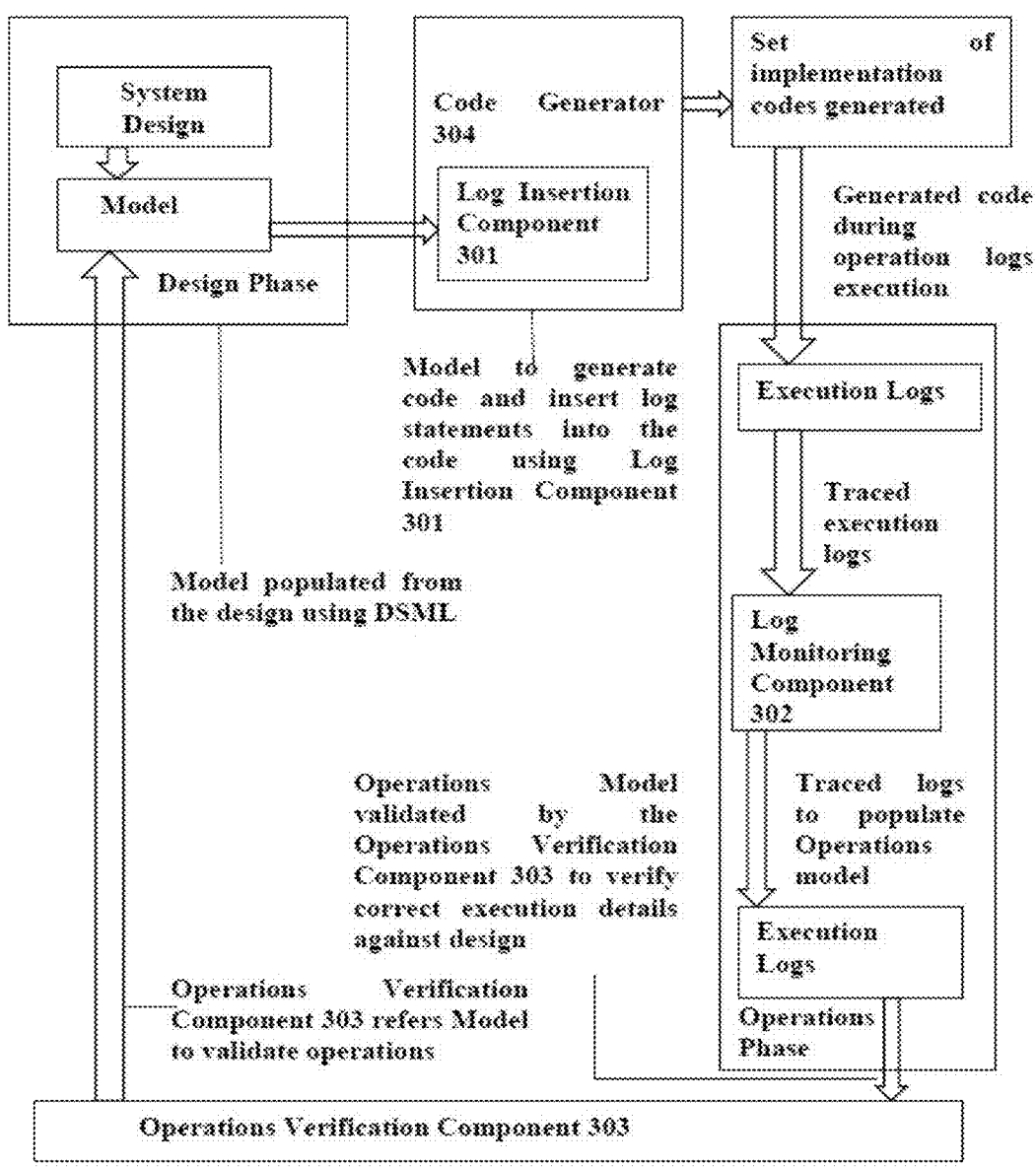
FIG. 3 is an architecture illustrating the components and flow of the system under consideration for identification of changes in the functional behavior and the runtime behavior during maintenance cycles (of the system under consideration) according to some embodiments of the present disclosure.
Figure 5:
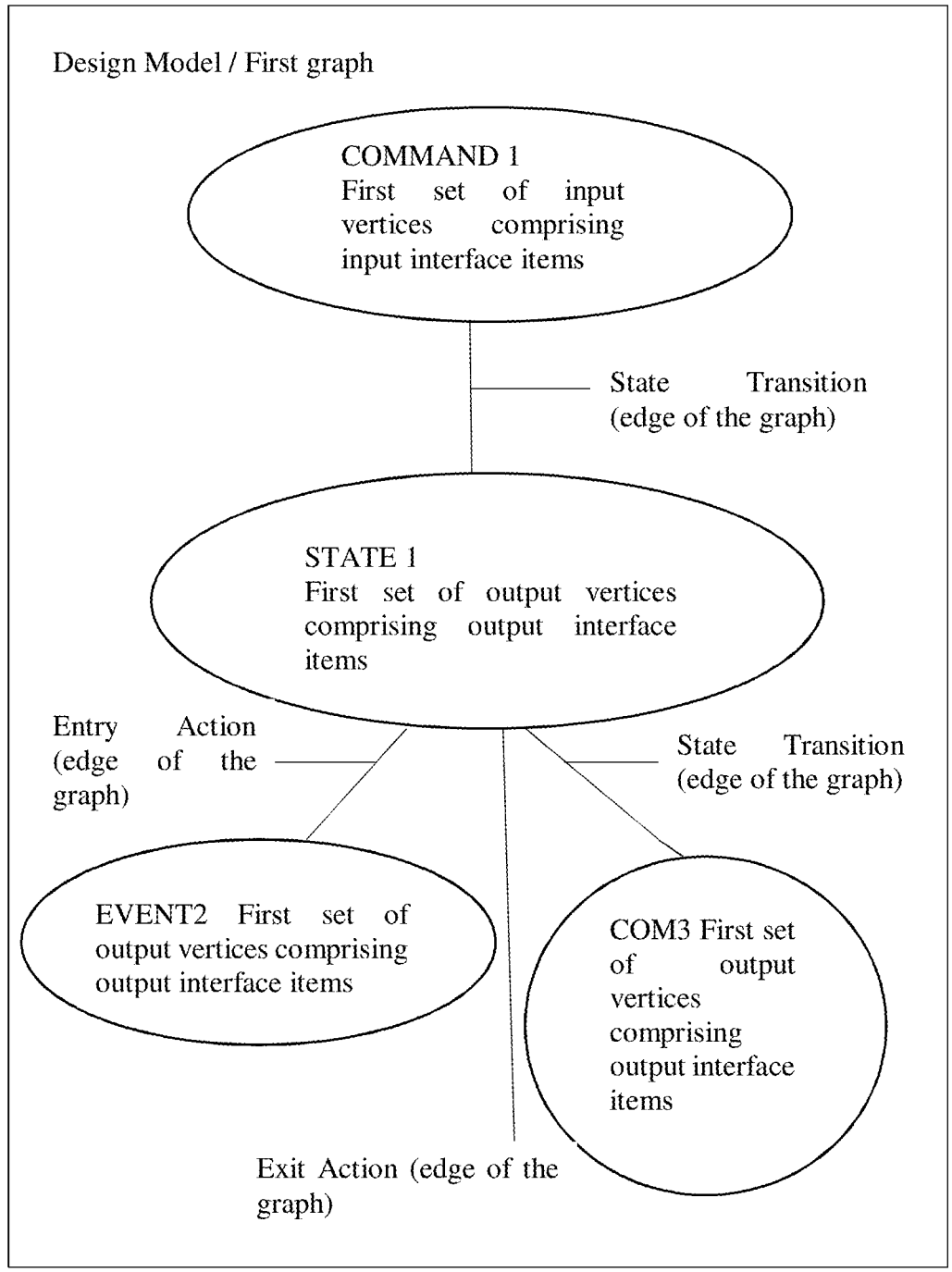
FIG. 5 illustrates an example graphical representation of a design model or a first graph generated based upon the system design for identifying changes in the functional behavior and the runtime behavior of the system under consideration according to some embodiments of the present disclosure.
Figure 6A:
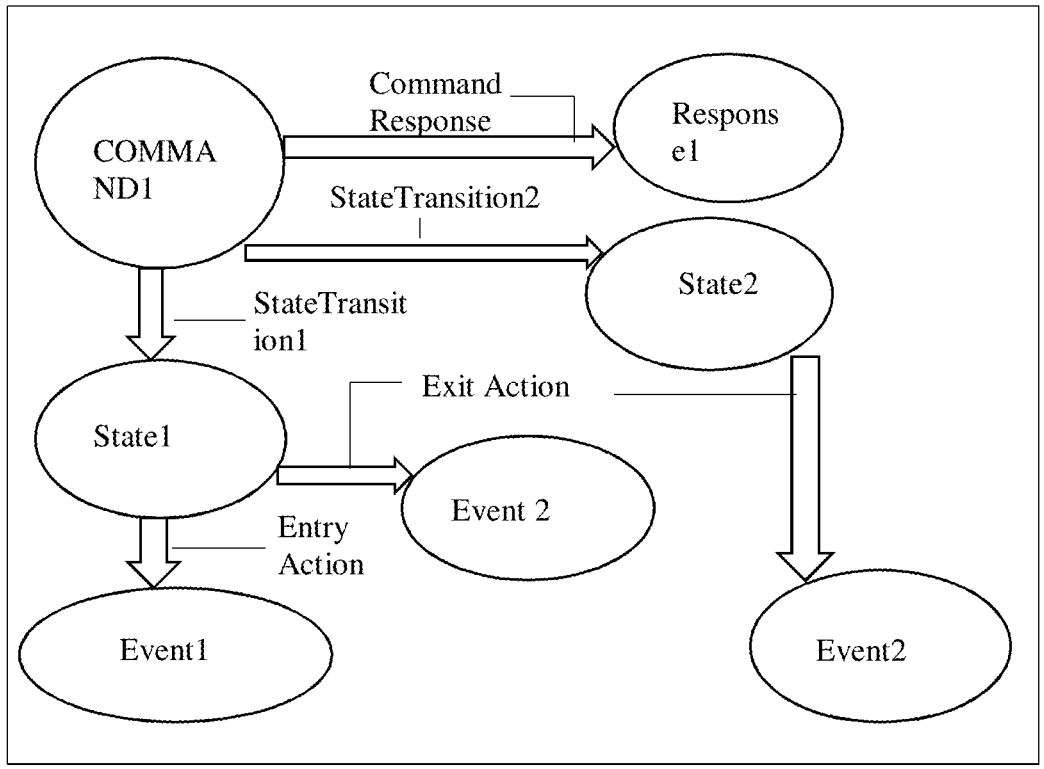
FIG. 6A illustrates an example of an interaction graph comprising of direct and indirect interactions within a controller according to some embodiments of the present disclosure.
Figure 6B:
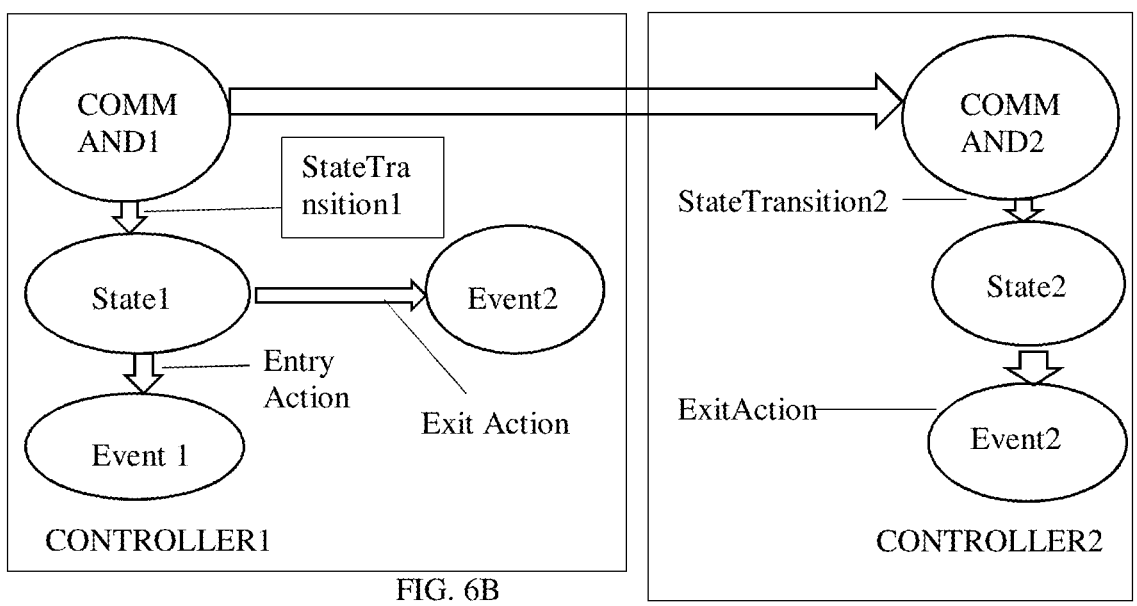
FIG. 6B illustrates another example of the interaction graph comprising of the direct and indirect interactions across the controller according to some embodiments of the present disclosure.

According to an embodiment of the present disclosure, referring to FIG. 3, the architecture and components of the system under consideration for identification of changes in the functional behavior and the runtime behavior during maintenance cycles may be referred. A log insertion component 301 update log files based upon a set of codes. The log insertion component 301 comprises of a listener (not shown in the figure) and the listener constantly checks the log files for any new entries in the log files. A log monitoring component 302 keeps a track of the log files and extracts the execution details from log statements for an operation. An operations verification component 303 compares and two models (that is, a reference model and an actual model) identify changes in behavior (function and/or runtime) of the system under consideration. Further, in case of any mismatch of values between the operations model and the design model then the operations verification component 303 notifies that the order of execution was not as expected although the behavior was valid. A code generator 304 inserts the log statements into the framework codes as key-value pairs.

According to an embodiment of the present disclosure, at step 201, the one or more hardware processors 104 acquire, a system design, wherein the system design comprises computer system concepts, structures and behavior corresponding to monitoring and control domain. In an embodiment, the system design may be captured by the one or more hardware processors 104 using a modeling language, for example, domain specific modeling language (DSML) like a Monitoring and Control Modeling Language (M&C ML). The DSML enables standardization of domain specific concepts, structures and behavior representations. The standardization ensures that the domain specific concepts, structures and behavior representations may be reused for solving similar computer system problems in Monitoring and Control domain.

In an example implementation, using the M&C ML, a design of supervisory control systems may be captured by the DSML. In an embodiment, the DSML is based upon Xtext (that is an open source software framework) and thus the DSML facilitates building of an Integrated Development Environment (IDE). In an embodiment, based upon the M&C ML DSML, the system design may be acquired the one or more hardware processors 104. Referring to FIGS. 4A and 4B, examples of the system design comprising of the computer system concepts, structures and behavior corresponding to the monitoring and control domain may be referred.

According to an embodiment of the present disclosure, at step 202, based upon the system design, a design model may be constructed (discussed in paragraph 38), wherein the design model comprises a first set of neighborhood values corresponding to the functional behavior elements of the system design. According to an embodiment of the present disclosure, a design table (corresponding to the design model) may be auto-created based upon the system design and using the modeling language. The design table serves as a reference against which the monitored activity could be verified. In an embodiment, the design table may be represented as a graph, that is a first graph, wherein the functional flow of the system under consideration derived from the system design may be represented as the first graph G(V,E), and wherein vertices, referred to as a first set of input vertices and a first set of output vertices of the first graph comprise of one or more interface components. Further, edges of the first graph are functions connecting the first set of input vertices and the first set of output vertices.

In an embodiment, the first graph indicates a flow of the function execution of the system under consideration with the one or more interface components serving as one or more input vertices or one or more output vertices (also referred to as the first set of input vertices and the first set of output vertices). The one or more interface components may be connected to multiple interface components through multiple functions, wherein the multiple interface components comprise of a plurality of components (other than the one or more interface components). For example, referring to FIG. 5, an example of the first graph representing the design model may be referred, wherein an instance of the one or more interface components command, "COM1" is connected to the plurality of components (other than the one or more interface components), that is, "STATE1", "EVENT2" and "COM3".

In an example implementation, referring to FIG. 5 again, it may be noted that "COM1" is the starting point or an input for the function "StateTransition" resulting into state "STATE1". Thus "STATE1" may be referred to as an output (or one or more output vertices) in the first set of output vertices. As discussed above, the first graph comprises of the one or more input vertices and the one or more output vertices. Hence ("COM1", "StateTransition", "STATE1") become a part of the functional flow. Similarly ("STATE1", "EntryAction", "EVENT2") and ("STATE1", "ExitAction", "COM3") are also branches of the functional flow of the system under consideration. Hence, it can be derived that the flow "COM1"→"STATE1"→EVENT2 comprises one of the paths that the system under consideration would be expected to execute during its operations. It may be noted that "StateTransition", "EntryAction", "ExitAction" etc form the edges of the first graph. Therefore, the edges in the first graph are the functions connecting the first set of input vertices and the first set of output vertices, and wherein the first graph indicates a flow of functional execution of the another system (or the system under consideration).

In an embodiment, referring to Table 1 below, an example of the design table auto-created based upon the system design and using the modeling language may be referred. In an embodiment, the design table as shown in Table 1 is created for an end to end path execution. An executing path may comprise of multiple sub-paths represented by the individual rows in Table 1. A sub-path comprises of an input indicated by the first column, an edge or function indicated in the first column and output indicated by the third column. The fourth column represents a set of design values, also called as the first set of neighborhood values, implying the distance between the inputs and the outputs. Thus, in an embodiment, the first set of neighborhood values comprise of a set of values generated based upon a distance between the first set of input vertices and the first set of output vertices in the first graph, and as discussed above, the vertices corresponding to the first graph further comprise of the one or more input vertices and the one or more output vertices.

In an example implementation, referring to FIG. 5 and Table 1 again below, it may be noted that the distance (that is, the first set of neighborhood values) between the first set of input vertices, that is, "COM1" and the first set of output vertices, that is, "STATE1" is 1. The distance between "COM1" and EVENT2 will be 2. Thus, immediate neighbors have distance of and it increases based on number of hops. This is done for all paths traversed within a controller as well as across the controllers. The embodiments of the present disclosure support creating similar tables for paths within and across the controllers. The design table stores the expected executions that could be monitored during runtime. The design table also serves as the reference against which the monitored activity could be verified. It thus provides a set of reference entities (comprising of the interface components and the first set of neighborhood values) by which actual design and intended design of the system under consideration may be compared. For example, referring to Table 1, it may be noted that that when "COM1" is fired, the functional execution would result into Response1.

TABLE 1

| Input Interface component | Output Interface component | Function | First set of Neighborhood values |
| --- | --- | --- | --- |
| Controller1.COM1 | Command and Response | Controller1.Response1 | 1 |
| Controller1.COM1 | Transition | Controller1.STATE1 | 1 |
| Controller1.COM1 | Entry Action | Controller1.Event1 | 2 |

In an embodiment, the first graph is an interaction graph, and wherein an interaction may be a direct interaction or an indirect interaction depending upon a number of edges corresponding to a functions of edge in the interaction graph. Further, the first set of neighborhood values vary depending upon the direct interaction or the indirect interaction in the interaction graph. In an example implementation, referring to FIGS. 6A and 6B, example of the interaction graph comprising of the direct interaction and the indirect interaction may be referred, where FIG. 6A corresponds to the direct interaction and the indirect interaction within a controller (not shown in the figure), while FIG. 6B refers to the direct interaction and the indirect interaction across the controller.

In an embodiment, the interaction graph is populated for the controller. The Controller comprises of the one or more interface items like "Commands", "Events", "States", "State Machine etc". When a design for the controller is defined, the one or more interface components and their intended behavior (using the DSML) may be defined. When the design is specified for the controller, the design details may then be then converted into a design model corresponding to the controller.

Referring to FIGS. 6A and 6B, again, the direct interaction, that is, when the one or more interface components interact via a single function, they become direct neighbors. For e.g. "COM1", "Response1" has a design value of 1 since they interact directly via "CommandResponse". This is an example of the direct interaction. Referring to FIGS. 6A and 6B again, an example of the indirect interaction may be referred, that is, when the one or more interface components interact indirectly via multiple functions, (for example, "Event1" which is the indirect or second neighbor of "COM1" and thus has a Neighbor Value of 2.

According to an embodiments of the present disclosure, at step 203, a set of implementation codes, based upon the system design may be auto-generated, wherein the set of implementation codes comprise, inter-alia, one or more framework based codes. In an embodiment, the system design captured using the M&C ML DSML may be translated into the set of implementation codes using a Domain Specific Engineering Environment (DSEE) framework. The set of implementation codes confirm to TANGO framework, an open source Supervisory control and data acquisition (SCADA) package. Further, as is known in the art, the TANGO conform to monitoring and control technology and domain.

Figure 7:
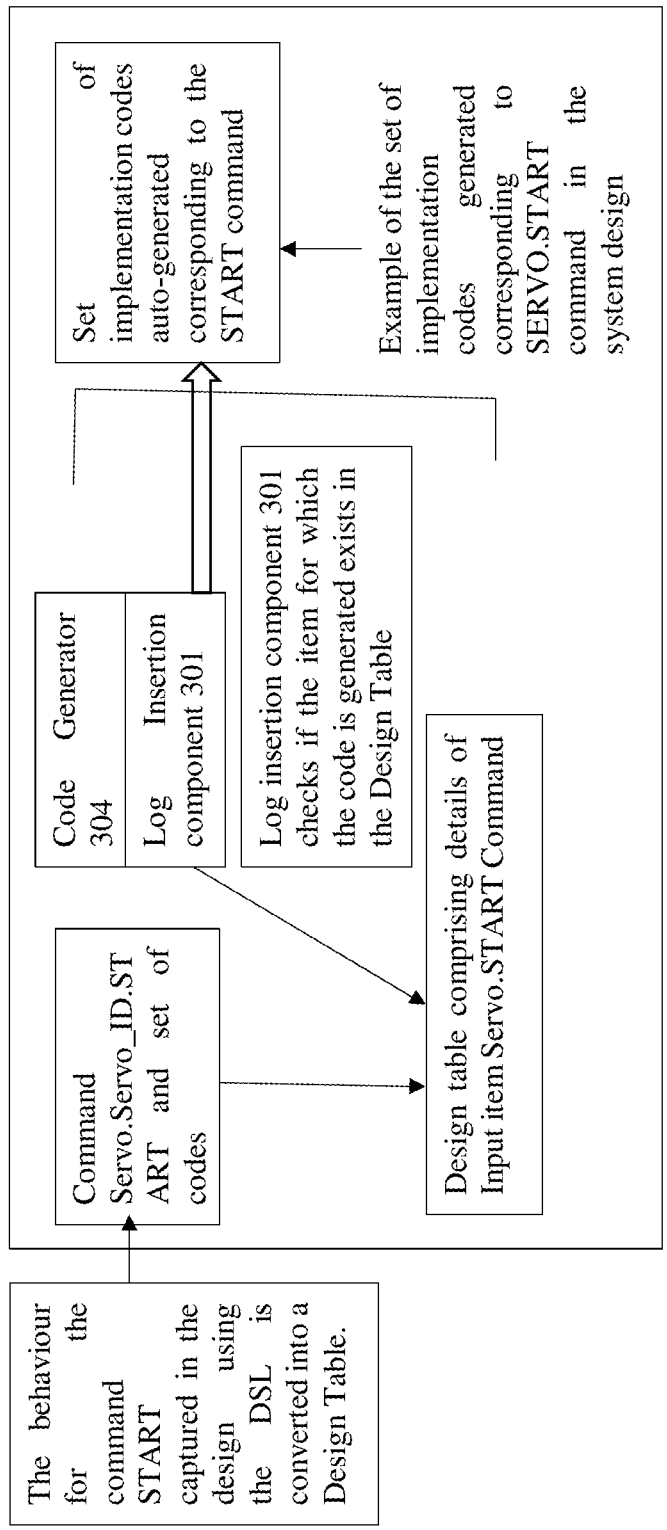
FIG. 7 illustrates an example of a set of implementation codes auto-generated based upon the system design according to some embodiments of the present disclosure.

In an example implementation, referring to FIG. 7, suppose the behavior for the command "START" captured in the system design using the DSML is converted into the design table. The details for input component Servo.START command exist in the design table. The log insertion component 301 checks if the component for which the code is generated (that is the command START) exists in the design table. Referring to FIG. 7 again, based upon the verification by the log insertion component 301 that the command "START" exists, the set of implementation codes corresponding to the "START" command may be generated as below:

```
@Command(name='START')
public String START (String.STARTParams) throws
DevFailed {xLogger. Entry( );
xLogger.info("COMMAND::START")
String STARTOut = null;
/*.......PROTECTED REGION ID(SERVO__CN.START) ENABLED
START
if (getstate( ).equals(DevState.ON)) {
setState(DevState.ON);
deviceManager.pushEvent("STARTED",EventType.USER__EVENT);
}
//Put command code here
xLogger.exit ( );
return StartOut;
}
```

According to an embodiments of the present disclosure, at step 204, the one or more hardware processors 104, update, using a log statement insertion component, a plurality of log statements into the set of implementation codes, wherein the plurality of log statements comprise information corresponding to the runtime behavior of the system under consideration. Further, the one or more hardware processors 104, populate, one or more log files, wherein the one or more log files comprise information corresponding to execution details of the system under consideration, and wherein the one or more log files are updated with the execution details using the plurality of log statements. This may now be discussed in detail.

In an embodiment, the one or more log files may be updated to enable extraction of a runtime behavior model of the system under consideration (comprising of details corresponding to the runtime behavior of the system under consideration) during its execution. Thus, the plurality of log statements are inserted into the one or more framework based codes to obtain the runtime behavior model when the system under consideration is executed. In an example implementation, a logic that may implement a command validation function may be instrumented or inserted to generate a log statement indicating that the command validation function has executed correctly.

According to an embodiment of the present disclosure, the plurality of log statements may be inserted into the one or more framework based codes (or the set of implementation codes) as one or more key-value pairs by a code generator 304 using the design table, and wherein a key comprises one or more components corresponding to the one or more interface components and a value is logged as a value corresponding to the key. For example, 'Key=COMMAND''value="COM1"' is inserted into the code block which triggers command "COM1". In an embodiment, apache log4j and Xloggers may be used for the implementation of logging.

In an embodiment, the log monitoring component 302 keeps a track of the one or more log files and extracts the execution details from the plurality of log statements for an operation. The log insertion component 301 comprises of the listener (not shown in the figure) and the listener constantly checks the one or more log files for any new entries in the one or more log files, that is, whenever any new entries in the one or more framework based codes are updated.

According to an embodiments of the present disclosure, at step 205, one or more models may be constructed based upon the one or more log files, wherein the one or more models comprise of a set of information corresponding to execution details of the system under consideration captured to derive a runtime view and operational details of the system under consideration. In an embodiment, the set of implementation codes while executing, log the system execution details (that is, the execution details of the system under consideration) which may be traced by the log monitoring component 302 to derive the runtime view of the system under consideration. The execution details captured in the one or more log files may be extracted and populated into an instance of a model. The one or more models generate a plurality of execution logs (via the one or more hardware processors 104) for further generating the set of information corresponding to the execution details of the system under consideration to be populated into an operations meta-model (discussed below).

In an example implementation, the one or more models may be constructed using a Eclipse Modelling Framework™ (EMF) framework. Using the EMF™ framework, a functional flow of the system under consideration, consisting of a sequence of domain specific function invocations may be captured by constructing the one or more models. For example, a flow may be defined as a Command "COM1" fired by a Controller. A triggering as Command "COM2" in another controller B. This information may be automatically derived from the one or more models constructed as part of a design view point.

Figure 8:
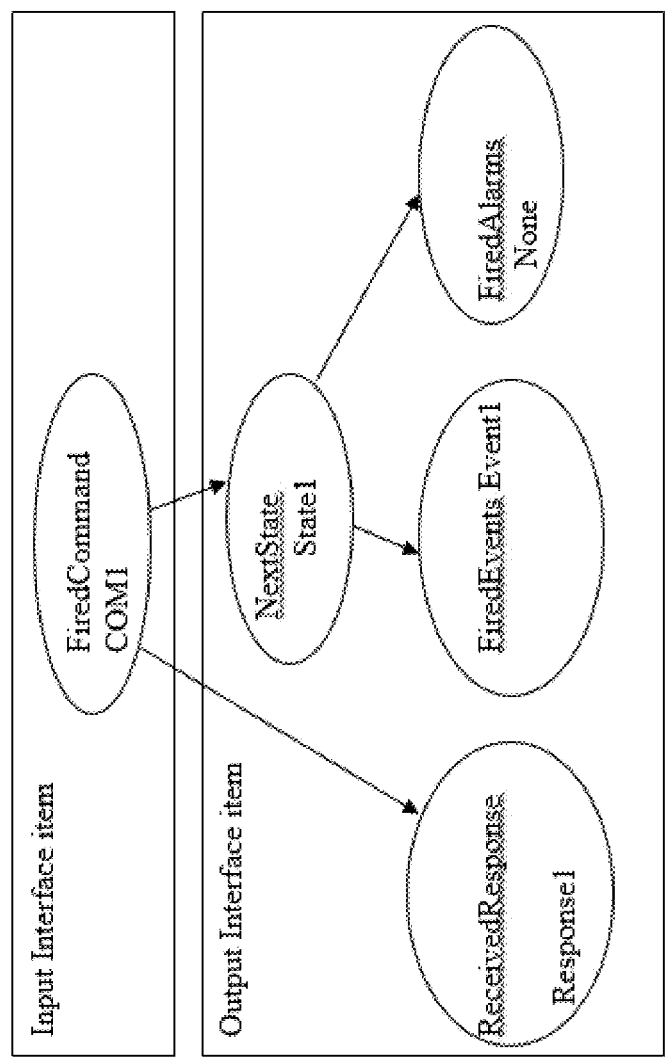
FIG. 8 illustrates an example of one or more models constructed based upon one or more log files according to some embodiments of the present disclosure.

In an example implementation, referring to FIG. 8, an example of the one or more models constructed based upon the one or more log files may be referred. The one or more models provide the understanding of the execution of the system under consideration in terms of the functional components that were executed after the set of commands were executed. Referring to FIG. 8 again, it may also be observed that the one or more models comprise a graphical structure.

According to an embodiment of the present disclosure, at step 206, based upon the one or more models the operations model may be constructed, wherein the operations model comprises a second set of neighborhood values corresponding to the execution details of the system under consideration to compare actual and intended designs of the system under consideration. In an embodiment, the operations model comprises a graphical representation of the runtime behavior of the system under consideration captured by the one or more models in the step 204 above. Thus, the operations model captures the actual execution details of the system under consideration.

According to an embodiment of the present disclosure, a set of operational information generated from the plurality of execution logs may be extracted and used to instantiate the operations model. It may be noted that the plurality of execution logs comprises the set of information corresponding to the execution details of the system under consideration. As discussed above, the plurality of execution logs comprising of the set of information corresponding to the execution details are generated by the one or more models. In an embodiment, the operations model implements a sub-set of concepts from the one or more models for capturing the runtime behaviour of the system under consideration. The operations model may, therefore, be observed as a refinement of the one or more models as sub-concepts and/or the set of information generated by the one or more models are implemented by the operations model to capture the runtime behaviour of the system under consideration.

In an example implementation, suppose the set of operational information generated from the plurality of execution logs may be as below:

---
Logging.txt
---
INFO 2017-05-26 17:46:18,557 c.m.n.j.Servo_CN.START:331 - COMMAND::START
    INFO 2017-05-26 17:46:18,558 c.m.n.j.Servo_CN.getMnc_STATE:97 -
        CURRENT_STATE::OFF
    INFO 2017-05-26 17:46:18,558 c.m.n.j.Servo_CN.setMnc_STATE:110 -
        NEXT_STATE::OFF
    INFO 2017-05-26 17:46:18,558 c.m.n.j.Servo_CN.setMnc_EVENT:134 -
        EVENT::STARTED
INFO 2017-05-26 17:46:18,557 c.m.n.j.Servo_CN.STOP:365 - COMMAND::STOP
    INFO 2017-05-26 17:46:18,558 c.m.n.j.Servo_CN.getMnc_STATE:97 -
        CURRENT_STATE::ON
    INFO 2017-05-26 17:46:18,558 c.m.n.j.Servo_CN.setMnc_STATE:110 -
        NEXT_STATE::OFF
    INFO 2017-05-26 17:46:18,558 c.m.n.j.Servo_CN.setMnc_EVENT:134 -
        EVENT::STOPPED
---

In an embodiment, as shown above, the set of operational information (logged into the one or more log files) comprises, inter-alia, controller name, command fired, response received, current state and next state, alarms and events raised etc. Suppose, first statement from the plurality of execution logs (updated by the one or more log files) shows that for Servo_CN controller, "START" command was fired. The State transition took place from current state OFF to the next state ON. In addition, an event "STARTED" was raised. Similarly, for any execution happening in the system under consideration, the set of operational information similar to above would be logged and generated.

As discussed above, the operations model implements a sub-set of concepts from the one or more models for capturing the runtime behaviour of the system under consideration. The operations model may, therefore, be observed as a refinement of the one or more models as sub-concepts and/or the set of information generated by the one or more models are implemented by the operations model to capture the runtime behaviour of the system under consideration. In an example implementation, suppose the one or more models comprise of concepts such as commands, operating state etc. which may be used to capture the system design details. Based upon the one or more models, the operations models may be constructed or instantiated by extracting the execution details from the one or more log files. Suppose, the one or more models comprises a concept of a command. Now the operations model may comprise of a concept like CommandFired which is derived from the concept of Command. Similarly other concepts in the operations model are may be from the one or more models, or in other words the operations model is a refinement over the one or more models to capture the operational details for the system under consideration.

Figure 9:
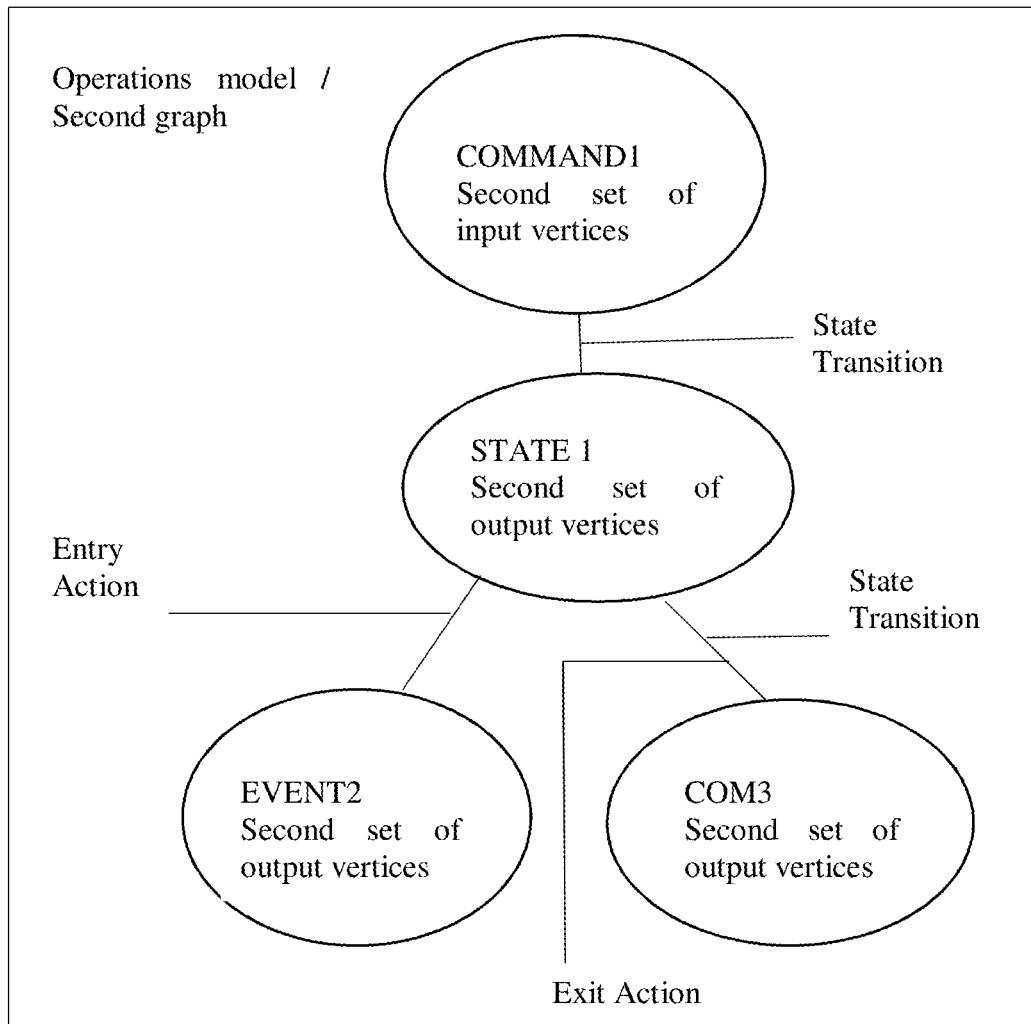
FIG. 9 shows a graphical representation of an operations model or a first graph generated based upon the system design for identifying changes in the functional behavior and the runtime behavior of the another system according to some embodiments of the present disclosure.

In an embodiment, the operations model may comprise of an operations model table, wherein the operations model table is populated from the constructed the one or more models. Further, the operations model table is responsible to for identifying the functional behavior elements executed by the system under consideration and arrange the functional behavior elements in order of their execution. Referring to FIG. 9, an example of the operations model may be referred. Referring to tables 2 and 3 below, examples of the operations model table comprising of the second set of neighborhood values (also known as operations distance) may be referred.

Figure 10:
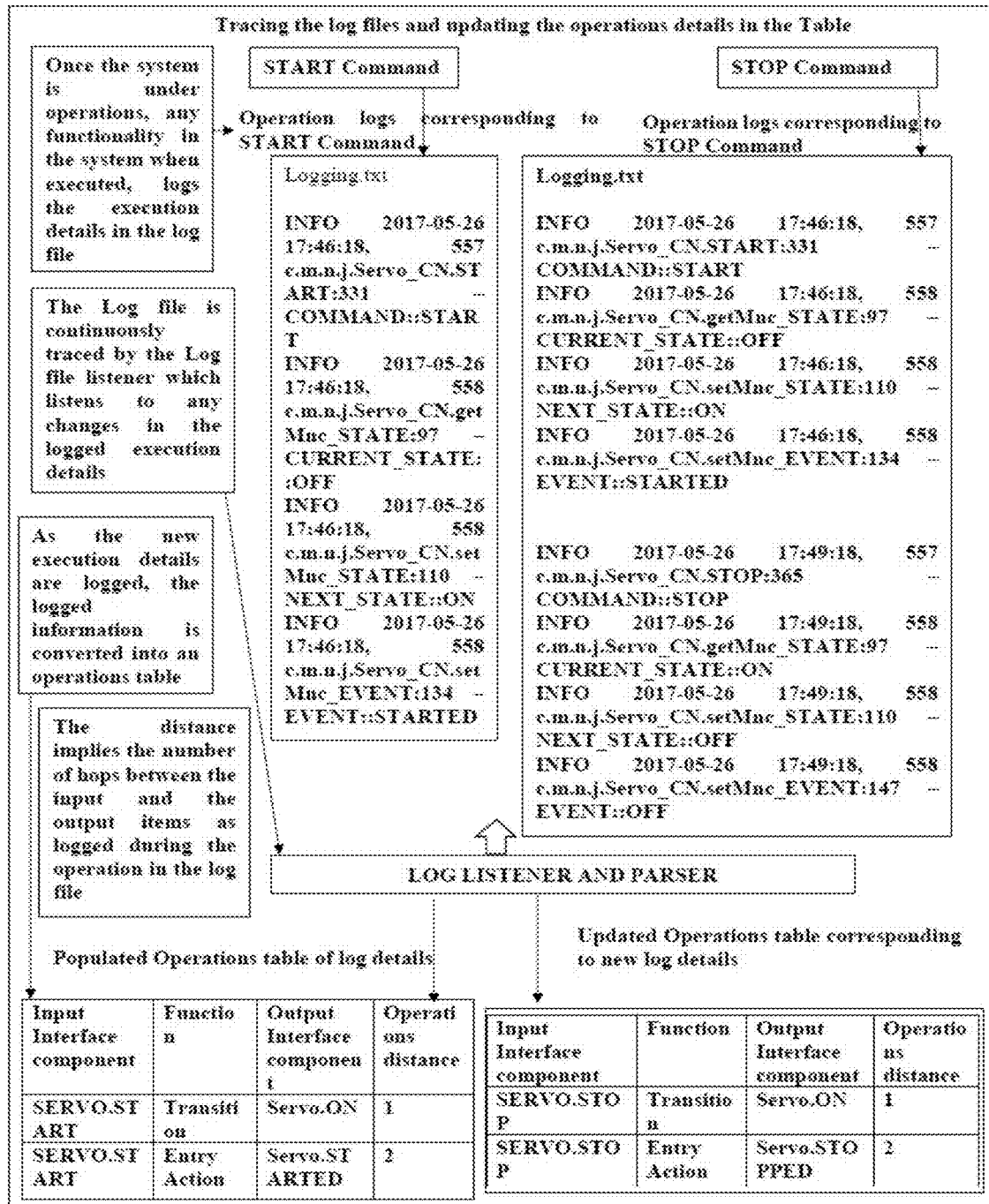
FIG. 10 illustrates tracing of the one or more log files and updating the operations model table according to some embodiments of the present disclosure.

In an embodiment, the second set of neighborhood values comprise of a set of values generated based upon a distance between a second set of input vertices and a second set of output vertices of the operations model represented in a second graph. In an example implementation, referring to FIG. 9 again, it may be noted that distance (that is, the second set of neighborhood values) between the second set of input vertices, that is, "COMMAND1" and the second set of output vertices, that is, "STATE1" is 1. The distance between "COMMAND1" and "EVENT2" will be 2. FIG. 10 depicts an architecture and flow of the operations model update that is based upon a set of executed functionalities corresponding to the system under consideration and the plurality of log statements inserted in the one or more log files to identify changes in the functional behavior and the runtime behavior of the system under consideration may be referred.

TABLE 2

| Input Interface component | Function | Output Interface component | Second set of Neighborhood values |
|---|---|---|---|
| Servo.START | Transition | SERVO.ON | 1 |
| Servo.START | Entry Action | SERVO.STARTED | 2 |

TABLE 3

| Input Interface component | Function | Output Interface component | Second set of Neighborhood values |
|---|---|---|---|
| Servo.STOPPED | Transition | SERVO.OFF | 1 |
| Servo.STOPPED | Entry Action | SERVO.STOPPED | 2 |

According to an embodiment of the present disclosure, at step 207, the operations model and the design table may be compared using an operations verification component 303 to identify changes in the functional behavior and the runtime behavior of the system under consideration. The one or more hardware processors 104, also compare, using the operations verification component 303, the operations model table and the design table for facilitating the comparison of the operations model and the design table for identifying changes in the functional behavior and the runtime behavior of the system under consideration. For example, the comparison helps to check if a state transition due to command execution by the system under consideration is in correspondence with the expected behavior of the system under consideration. The comparison may now be discussed in detail.

In an embodiment initially, both the operations model (comprising of the operations model table) and the design table are compared to identify any identical or matching input-output parameters (for example, input interface and output interface) components. In an example implementation, referring to columns A and B of Tables 4 and 5 below, it may be noted that both the tables comprise of similar input-output parameters.

TABLE 4

| Design table | | |
|---|---|---|
| Input Interface component (A) | Output Interface component (B) | Neighborhood values (C) |
| Controller1.Command1 | Controller1.Response1 | 1 |
| Controller1.Command1 | Controller1.STATE1 | 1 |
| Controller1.Command1 | Controller1.Event1 | 2 |

TABLE 5

| Operations model table | | |
|---|---|---|
| Input Interface component (A) | Output Interface component (B) | Neighborhood values (C) |
| Controller1.Command1 | Controller1.Response1 | 1 |
| Controller1.Command1 | Controller1.STATE1 | 1 |
| Controller1.Command1 | Controller1.Event1 | 2 |

According to an embodiment of the present disclosure, if both the design model table and the operations model table comprise of the matching input-output parameters, the corresponding neighborhood values in column C may be matched. In an example implementation, referring to tables 4 and 5 again, it may be noted that the corresponding neighborhood values are same.

According to an embodiment of the present disclosure, if both the design model table and the operations model table comprise of the matching neighborhood values, the runtime behavior from both the operations model and the design model may be declared to be in synchronization with the system design. In an example implementation, referring to tables 4 and 5 again, it may be noted that since both the operations model and the design model comprise of the matching input-output parameters and the matching neighborhood values, the runtime behavior corresponding to row1 of both the tables may be declared to be in synchronization with the system design and hence it may be concluded that the functionality "CommandResponse" has been executed correctly. Similarly, the other rows of the design table and the operations model table may then be compared and checked to verify the executed operations against the design.

According to an embodiment of the present disclosure, in case any of the above conditions are not satisfied, the operations verification component 303 generates one or more notifications that may accordingly me acted upon by the stakeholders or system engineers. In an embodiment, the one or more notifications may be generated when the input and output parameters in both the tables match along with their corresponding neighborhood values thereby generating a success notification. Further, if the neighborhood values do not match, then the operations verification component 303 notifies that the order of execution was not as expected although the behavior was valid. Finally, if both the conditions fail then the verification module notifies that the M&C based system encountered a behavior that was not specified as a part of the design intentions. In an example implementation, the one or more notifications generated by the operations verification component 303 may be as:

The Alarm:-POWER_OUT was raised successfully while state transition Correct responseRES_DOMON was received from Command:DOMON Command DOMON successfully validated against design objectives The transition from State:-START=>START is successfully operational According to an embodiment of the present disclosure, a comparison of the proposed disclosure with traditional methods may now be considered. Referring to Table 6 below, inputs for the comparison may be referred. Column A in Table 6 indicates the number of iterations of the experiment to perform the comparison. Column B indicates the instances of design elements such as command, event, and alarm used for the comparison. Column C indicates the resultant behavior elements required to be logged to generate the design table. Column D indicates the number of design elements that were changed in each test iteration. Column E indicates how many other design elements were impacted because of the introduced change. Column F indicates how many logs were generated for every round of the experiment or perform the comparison.

| Number of iterations (A) | Instances of design elements (B) | Resultant behavior elements of the system (C) | Modified design elements (D) | Number of other design elements modified (E) | Logs generated per iteration (F) |
|---|---|---|---|---|---|
| 1 | 10 | 10 | 4 | 7 | 13 |
| 2 | 15 | 14 | 2 | 4 | 28 |
| 3 | 20 | 17 | 6 | 13 | 46 |
| 4 | 26 | 16 | 6 | 12 | 23 |

The comparison was performed to check, inter-alia, the number of newly introduced changes in the design that could be detected by the proposed disclosure and in what timeframe, the number of changes made in the implementation that could be detected by using the traditional methods which impacted the design and time, how do the results compare based on the number of changes detected and time taken. In an embodiment, the initial design was created using the M&C ML and the corresponding TANGO based implementation was generated from the design.

In an embodiment, initially the traditional methods were used for identification of changes in the functional behavior and the runtime behavior of the system under consideration. The traditional methods were implemented using one or more tools, for example, a log analysis tool like GAMUT were implemented for updating the one or more log files. GAMUT was used to provide a query interface for generating multiple queries to filter contents from the one or more log files. Further, using the traditional methods, changes were made at the level of the implementation without updating the existing corresponding design and the system under consideration was executed over a period of time to generate the one or more log files for further analysis, the multiple queries were executed to filter out the contents based on the notion of behavior points from the one or more log files using GAMUT, output from the contents filtered was compared against the system design and the process was iterated to refine the queries till the changes in the system under consideration were identified by iterative comparison against the system design. Referring to Table 7 below, results obtained by using the traditional methods may be referred.

TABLE 7

| Time taken (in minutes) (A) | Number of queries created (B) | Changes identified (C) |
|---|---|---|
| 4 | 2 | 6 |
| 5 | 2 | 3 |
| 12 | 3 | 9 |
| 18 | 12 | 7 |

In an embodiment, referring to Table 7 again, the results obtained using the traditional methods may be considered. It may be noted that using the traditional methods, number of behavior changes in the system under consideration may be directly proportional to the time taken to identify the change and the number of queries that need to be executed, manual identification of changes resulted in inconsistent success rate with an inclination towards lower success rate in case of scenarios with more the number of behavior changes. Further, the traditional methods require lot of manual efforts and knowledge about the system design. Finally, there is a high probability of false positive cases using the traditional methods which leads to error in log analysis and identification of changes.

According to an embodiment of the present disclosure, identification of changes in the functional behavior and the runtime behavior of the system under consideration was performed using the proposed disclosure. Referring to Table 8 below, the results obtained using the proposed methodology may be referred. Referring to Table 8 again, it may be noted that the number of changes introduced into the system hardly affects the time taken to identify the changes, there is no effort involved in creating queries to filter the contents from the one or more log files and identify the changes in the system execution. Finally, using the proposed methodology rate of success is very high as compared to the traditional methods. However, there could be some changes in success rate based on the composition of the plurality of log statements and the domain model. However, the proposed disclosure still achieves a very high success rate in comparison with the traditional methods.

TABLE 8

| Time taken (in minutes) (A) | Number of queries created (B) | Changes identified (C) |
| --- | --- | --- |
| 0.001 | 0 | 7 |
| 0.001 | 0 | 4 |
| 0.001 | 0 | 13 |
| 0.001 | 0 | 12 |

Figure 11:
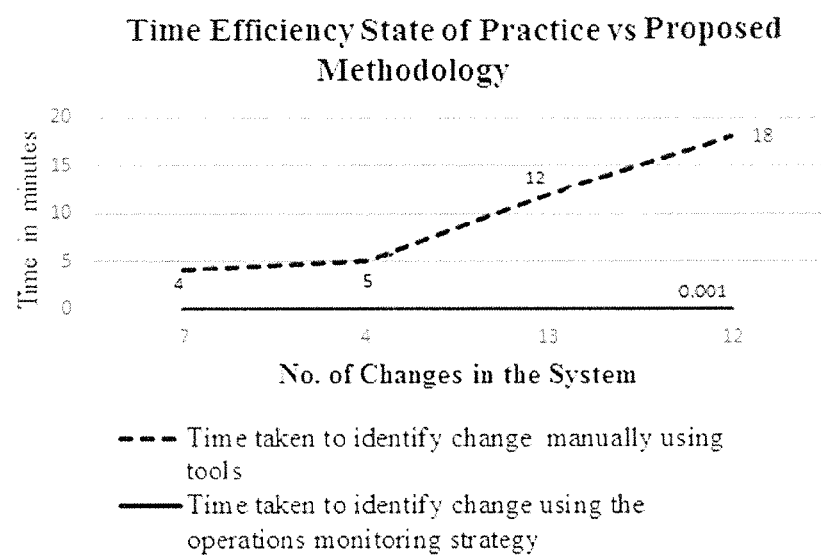
FIG. 11 shows a graphical representation of a comparison between traditional methods and proposed disclosure with respect to time taken to identify changes in the system design for identifying changes in the functional behavior and the runtime behavior of the another system according to some embodiments of the present disclosure.
Figure 12:
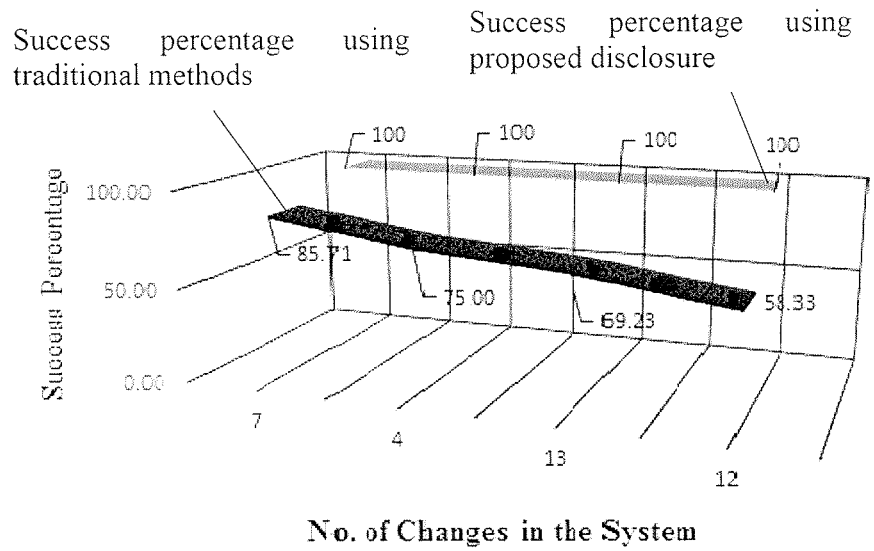
FIG. 12 shows a graphical representation of the comparison between the traditional methods and the proposed disclosure with respect to percentage of success achieved by implementing the proposed disclosure in comparison with the traditional methods for identifying changes in the functional behavior and the runtime behavior of the another system according to some embodiments of the present disclosure.

Referring to FIGS. 11 and 12, graphical representations of the comparison of the proposed disclosure with the traditional methods may be considered. Referring to FIG. 11 again, it may be noted that the traditional methods are reactive and involve manual efforts for understanding the system design as well as the execution. Referring to table 8 and FIG. 11 again, it may be noted that the rate of success for identification of changes in the functional behavior and the runtime behavior of the system is very high using the proposed disclosure (as discussed above) as compared to the traditional methods. Further, the traditional methods consider the problem of change identification de-coupled from the system design, making the process further human dependent. As a result, the time and probability of error increases.

In comparison, the proposed methodology addresses the problem of change identification by viewing the system design from the operations viewpoint creating a common reference for the design and the operation. As the system under consideration executes, the logged execution details may be proactively validated by the proposed disclosure to check the execution of the system consistency with the design. The discrepancies are also highlighted and notified proactively by the proposed disclosure.

According to an embodiment of the present disclosure, technical advantages of the proposed disclosure may now be considered in detail. The proposed disclosure almost eliminates manual efforts which are required for understanding the system design for identification of changes in the functional behavior and the runtime behavior of the system under consideration. Referring to table 5 again, it may be noted that in the traditional methods, the number of behavior changes in the system under consideration may be directly proportional to the time taken to identify the change and the number of queries that need to be executed and manual identification of changes resulted in inconsistent success rate with an inclination towards lower success rate in case of scenarios with more number of behavior changes.

In an embodiment, referring to table 6 again, it may be noted that by implementing the proposed disclosure, the number of changes introduced into the system under consideration hardly affects the time taken to identify the changes, there is no effort involved in creating queries to filter the contents from the log files and identify the changes in the system execution.

Finally, rate of success is very high using the proposed disclosure. Thus, the proposed disclosure addresses the problem of change identification by viewing the system design from the operations viewpoint and creating a common reference for the system design and the operation. As the system under consideration executes, the logged execution details are proactively validated by the methodology to check its consistency with the system design.

In an embodiment, the memory 102 can be configured to store any data that is associated with identification of changes in the functional behavior and the runtime behavior of the system under consideration during maintenance cycles. In an embodiment, the information pertaining to the system design, the set of implementation codes, the design table and the operations model table etc. are stored in the memory 102. Further, all information (inputs, outputs and so on) pertaining to identification of changes in the functional behavior and the runtime behavior of the system under consideration during maintenance cycles may also be stored in the database, as history data, for reference purpose. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method for identification of changes in functional behavior and runtime behavior of a system during maintenance cycles, the method comprising a processor implemented steps of:
    acquiring, by one or more hardware processors, a system design, wherein the system design comprises computer system concepts, structures and behavior corresponding to monitoring and control domain;
    constructing, a design model, based upon the system design, wherein the design model comprises a first set of neighborhood values corresponding to the functional behavior elements of the system design;

auto-generating, a set of implementation codes, based upon the design model and the system design, wherein the set of implementation codes comprise one or more framework based codes;

performing, by the one or more hardware processors, a plurality of steps, based upon the set of implementation codes, wherein the plurality of steps comprise:
 (i) updating, using a log statement insertion component, a plurality of log statements into the set of implementation codes, wherein the plurality of log statements comprise information corresponding to the runtime behavior of the system; and
 (ii) populating, one or more log files, wherein the one or more log files comprise information corresponding to execution details of the system, and wherein the one or more log files are updated with the execution details using the plurality of log statements;

constructing, one or more models, based upon the one or more log files, wherein the one or more models comprise of a set of information corresponding to the execution details of the system captured to derive a runtime view and operational details of the system;

constructing, an operations model, based upon the one or more models, wherein the operations model comprises a second set of neighborhood values corresponding to the execution details of the system to compare actual and intended designs of the system; and comparing, using an operations verification component, the operations model and a design table, to identify changes in the functional behavior and the runtime behavior of the system.

2. The method of claim 1, wherein the second set of neighborhood values comprise of a set of values generated based upon a distance between a second set of input vertices and a second set of output vertices of the operations model represented in a second graph.

3. The method of claim 1, wherein the design table is auto-created based upon the system design and using a modeling language to generate a set of reference entities, and wherein the set of reference entities facilitate identification of changes in the runtime behavior of the system.

4. The method of claim 1, wherein the design table is represented in a first graph comprising of a first set of input vertices and a first set of output vertices, wherein the first set of input vertices comprise of one or more interface components, wherein edges in the first graph are functions connecting the first set of input vertices and the first set of output vertices, and wherein the first graph indicates a flow of functional execution of the system.

5. The method of claim 4, wherein the design table comprises of the first set of neighborhood values corresponding to the design model, wherein the first set of neighborhood values are generated based upon the system design for facilitating the comparison of the operations model and the design table, and wherein the first set of neighborhood values are further generated based upon a distance between the first set of input vertices and the first set of output vertices in the first graph.

6. The method of claim 1, wherein the plurality of log statements are inserted into the one or more framework based codes as one or more key-value pairs by a code generator using the design table and wherein a key comprises one or more components corresponding to one or more interface components and a value is logged as a value corresponding to the key.

7. The method of claim 1, wherein the operations model is updated based upon a set of executed functionalities corresponding to the system and the plurality of log statements inserted in the one or more log files to identify changes in the functional behavior and the runtime behavior of the system.

8. The method of claim 4, wherein the first graph is an interaction graph, and wherein an interaction in the interaction graph comprises of a direct interaction or an indirect interaction depending upon a number of edges corresponding to a function of the edges in the interaction graph.

9. The method of claim 1, wherein the second set of neighborhood values vary depending upon a direct interaction or an indirect interaction in an interaction graph.

10. A system comprising:
a memory storing instructions;
one or more communication interfaces; and
one or more hardware processors coupled to the memory via the one or more communication interfaces, wherein the one or more hardware processors are configured by the instructions to:
 acquire, by the one or more hardware processors, a system design, wherein the system design comprises computer system concepts, structures and behavior corresponding to monitoring and control domain;
 construct, a design model, based upon the system design, wherein the design model comprises a first set of neighborhood values corresponding to functional behavior elements of the system design;
 auto-generate, a set of implementation codes, based upon the design model and the system design, wherein the set of implementation codes comprise one or more framework based codes;
 perform, by the one or more hardware processors, a plurality of steps, based upon the set of implementation codes, wherein the plurality of steps comprise:
  (i) update, using a log statement insertion component, a plurality of log statements into the set of implementation codes, wherein the plurality of log statements comprise information corresponding to runtime behavior of another system; and
  (ii) populate, one or more log files, wherein the one or more log files comprise information corresponding to execution details of the another system, and wherein the one or more log files are updated with the execution details using the plurality of log statements;
 construct, one or more models, based upon the one or more log files, wherein the one or more models comprise of a set of information corresponding to the execution details of the another system captured to derive a runtime view and operational details of the another system;
 construct, an operations model, based upon the one or more models, wherein the operations model comprises a second set of neighborhood values corresponding to the execution details of the another system to compare actual and intended designs of the another system; and
 compare, using an operations verification component, the operations model and a design table, to identify changes in the functional behavior and the runtime behavior of the another system.

11. The system of claim 10, wherein the second set of neighborhood values comprise of a set of values generated based upon a distance between a second set of input vertices and a second set of output vertices of the operations model represented in a second graph.

12. The system of claim 10, wherein the design table is auto-created based upon the system design and using a modeling language to generate a set of reference entities, and wherein the set of reference entities facilitate identification of changes in the runtime behavior of the another system.

13. The system of claim 10, wherein the design table is represented in a first graph comprising of a first set of input vertices and a first set of output vertices, wherein the first set of input vertices comprise of one or more interface components, wherein edges in the first graph are functions connecting the first set of input vertices and the first set of output vertices, and wherein the first graph indicates a flow of functional execution of the another system.

14. The system of claim 13, wherein the design table comprises of the first set of neighborhood values corresponding to the design model, wherein the first set of neighborhood values are generated based upon the system design for facilitating the comparison of the operations model and the design table, and wherein the first set of neighborhood values are further generated based upon a distance between the first set of input vertices and the first set of output vertices in the first graph.

15. The system of claim 10, wherein the plurality of log statements are inserted into the one or more framework based codes as one or more key-value pairs by a code generator using the design table and wherein a key comprises one or more components corresponding to one or more interface components and a value is logged as a value corresponding to the key.

16. The system of claim 10, wherein the operations model is updated based upon a set of executed functionalities corresponding to the system and the plurality of log statements inserted in the one or more log files to identify changes in the functional behavior and the runtime behavior of the another system.

17. The system of claim 14, wherein the first graph is an interaction graph, and wherein an interaction in the interaction graph comprises of a direct interaction or an indirect interaction depending upon a number of edges corresponding to a function of the edges in the interaction graph.

18. The system of claim 10, wherein the second set of neighborhood values vary depending upon a direct interaction or an indirect interaction in an interaction graph.

19. One or more non-transitory machine readable information storage mediums comprising one or more instructions which when executed by one or more hardware processors causes the one or more hardware processor to perform a method for identification of changes in functional behavior and runtime behavior of a system during maintenance cycles, said method comprising:
  acquiring a system design, wherein the system design comprises computer system concepts, structures and behavior corresponding to monitoring and control domain;
  constructing, a design model, based upon the system design, wherein the design model comprises a first set of neighborhood values corresponding to the functional behavior elements of the system design;
  auto-generating, a set of implementation codes, based upon the design model and the system design, wherein the set of implementation codes comprise one or more framework based codes;
  performing, by the one or more hardware processors, a plurality of steps, based upon the set of implementation codes, wherein the plurality of steps comprise:
    (i) updating, using a log statement insertion component, a plurality of log statements into the set of implementation codes, wherein the plurality of log statements comprise information corresponding to the runtime behavior of the system; and
    (ii) populating, one or more log files, wherein the one or more log files comprise information corresponding to execution details of the system, and wherein the one or more log files are updated with the execution details using the plurality of log statements;
  constructing, one or more models, based upon the one or more log files, wherein the one or more models comprise of a set of information corresponding to the execution details of the system captured to derive a runtime view and operational details of the system;
  constructing, an operations model, based upon the one or more models, wherein the operations model comprises a second set of neighborhood values corresponding to the execution details of the system to compare actual and intended designs of the system; and
  comparing, using an operations verification component, the operations model and a design table, to identify changes in the functional behavior and the runtime behavior of the system.

20. The one or more non-transitory machine readable information storage mediums of claim 19, wherein the second set of neighborhood values comprise of a set of values generated based upon a distance between a second set of input vertices and a second set of output vertices of the operations model represented in a second graph.

* * * * *